(12) United States Patent
Wang

(10) Patent No.: US 8,853,534 B2
(45) Date of Patent: Oct. 7, 2014

(54) MULTI-DIRECTIONAL MOUNTING FACEPLATE

(75) Inventor: Chu-Li Wang, Taipei (TW)

(73) Assignee: Emcom Technology Inc., Taipei (TW)

( * ) Notice: Subject to any disclaimer, the term of this patent is extended or adjusted under 35 U.S.C. 154(b) by 396 days.

(21) Appl. No.: 12/983,326

(22) Filed: Jan. 2, 2011

(65) Prior Publication Data

US 2011/0186326 A1    Aug. 4, 2011

(30) Foreign Application Priority Data

Feb. 2, 2010   (TW) .............................. 99103074 A

(51) Int. Cl.
*H05K 5/03* (2006.01)

(52) U.S. Cl.
CPC ........................................ *H05K 5/03* (2013.01)
USPC ............................................... 174/66; 174/67

(58) Field of Classification Search
USPC .................................................... 174/66, 67
See application file for complete search history.

(56) References Cited

U.S. PATENT DOCUMENTS

| | | | | |
|---|---|---|---|---|
| 5,533,637 | A * | 7/1996 | Williams, Jr. ................... | 220/3.8 |
| 7,091,416 | B1 * | 8/2006 | Tsentr et al. .................... | 174/66 |
| 7,390,964 | B2 | 6/2008 | Gorin et al. | |
| 7,563,979 | B1 * | 7/2009 | Gretz .............................. | 174/66 |
| 7,897,870 | B1 * | 3/2011 | Gretz .............................. | 174/58 |
| 8,097,805 | B2 * | 1/2012 | Drane et al. .................... | 174/50 |
| 2008/0110886 | A1 * | 5/2008 | Provenzano et al. ......... | 220/241 |

* cited by examiner

*Primary Examiner* — William H Mayo, III
*Assistant Examiner* — Hiram E Gonzalez
(74) *Attorney, Agent, or Firm* — Cheng-Ju Chiang

(57) ABSTRACT

A multi-directional mounting faceplate for managing a plurality of cables is provided. The mounting faceplate includes a faceplate body and a nose cover, wherein the faceplate body has an opening disposed about the center of the faceplate body. The cross-sectional shape of the nose cover is similar to the shape of the opening. The nose cover has two side plates and a linking plate which is connected between the two side plates, such that the nose cover can be rotatably connected to the faceplate body to change the open direction of the mounting faceplate.

18 Claims, 10 Drawing Sheets

MULTI-DIRECTIONAL MOUNTING FACEPLATE

BACKGROUND OF THE INVENTION

1. Field of the Invention

The present invention relates to a mounting faceplate for managing a plurality of cables and particularly relates to a wall-mount faceplate with a rotatable nose cover.

2. Description of the Prior Art

Generally, the transmission lines of audio and video devices such as audio system, television, computer, and home theater are connected to the system line of the building through wall-mount faceplates corresponding to holes in the wall.

FIG. 1 is a perspective view of a traditional wall-mount faceplate. The conventional wall-mount faceplate 10 includes a faceplate body 1 and a rectangular cover 2. The faceplate body 1 has an opening 3 close to one side of the faceplate body 1. The size of the opening 3 is almost a half of the faceplate body 1. The shape of the opening 3 is similar to the shape of the open space 4 of the rectangular cover 2, and the opening 3 communicates with the open space 4 of the rectangular cover 2 to guide and manage a plurality of cables (not shown). As shown in FIG. 1, the faceplate body 1 and the rectangular cover 2 are made in one piece and mounted on the wall through a plurality of holes 5 around the opening 3 which corresponds to the hole in the wall.

However, the structure of the conventional wall-mount faceplate 10 is for embedding in the wall only. That is, the rectangular cover 2 must be embedded into the hole in the wall. For the case that no sufficient space is provided inside the wall or the transmission lines of audio and video devices need to be actively guided and managed, the conventional wall-mount faceplate 10 lacks suitable flexibility to accommodate such needs. To improve the above mentioned problems, an inventive mounting faceplate is provided.

SUMMARY OF THE INVENTION

One object of the present invention is to provide a mounting faceplate with a rotatable nose cover.

Another object of the present invention is to provide a wall-mount faceplate with multiple assembly configurations for flexible cable management.

The present invention is related to a mounting faceplate for managing a plurality of cables. The mounting faceplate includes a faceplate body and a nose cover, wherein the faceplate body has an opening near its center portion. The cross-sectional shape of the nose cover is similar to the shape of the opening. The nose cover has two side plates and a linking plate connected between the two side plates. A pivot unit is provided between the nose cover and the faceplate body, so that the nose cover can be rotatably connected to the faceplate body to selectively change the open direction of the opening.

In one embodiment, bumps are formed at two opposite ends of the linking plate so that the nose cover can be selectively engaged with the faceplate body from different sides of the opening. The linking plate further includes a stopper and a groove, wherein the groove is formed between the stopper and the bump. The stopper vertically extends upward from the surface of linking plate to limit the moving range of the nose cover in the open direction of the opening. The groove is formed surrounding the bump so that the bump has certain flexibility. In one embodiment, the bump has only one side connected to the linking plate to allow the bump to be flexible. The bump is a raised part protruding from the surface of the linking plate. The faceplate body is further formed with a positioning portion on one side of the opening, wherein the positioning portion is provided for engaging with the bump to position the nose cover.

Moreover, the pivot unit includes a pivot rod and a pivot hole interchangeably disposed on the nose cover and the faceplate body, respectively. For example, the pivot hole is provided on the side plate of the nose cover to be connected to the pivot rod formed on the inner wall of the faceplate body around the opening. In other embodiments, each of the two side plates includes a pivot rod and the inner wall of the faceplate body around the opening includes a corresponding pivot hole for coupling with the pivot rod, so that the nose cover can rotate about the pivot unit with a rotation angle ranging from 0 to 90 degrees.

DETAILED DESCRIPTION OF THE PREFERRED EMBODIMENT

The present invention provides a mounting faceplate structure for guiding and managing a plurality of cables to meet different construction needs. The mounting faceplate described herein is preferably mounted on the wall as a wall-mount faceplate and has an opening corresponding to the hole in the wall to allow transmission lines to go therethrough. However, in other embodiments, the mounting faceplate can have more than one opening accompanied with more than one nose cover to allow transmission lines to go therethrough, respectively. The structure and operation of the present invention will be described in detail with reference to the accompanied figures.

Figure 1:
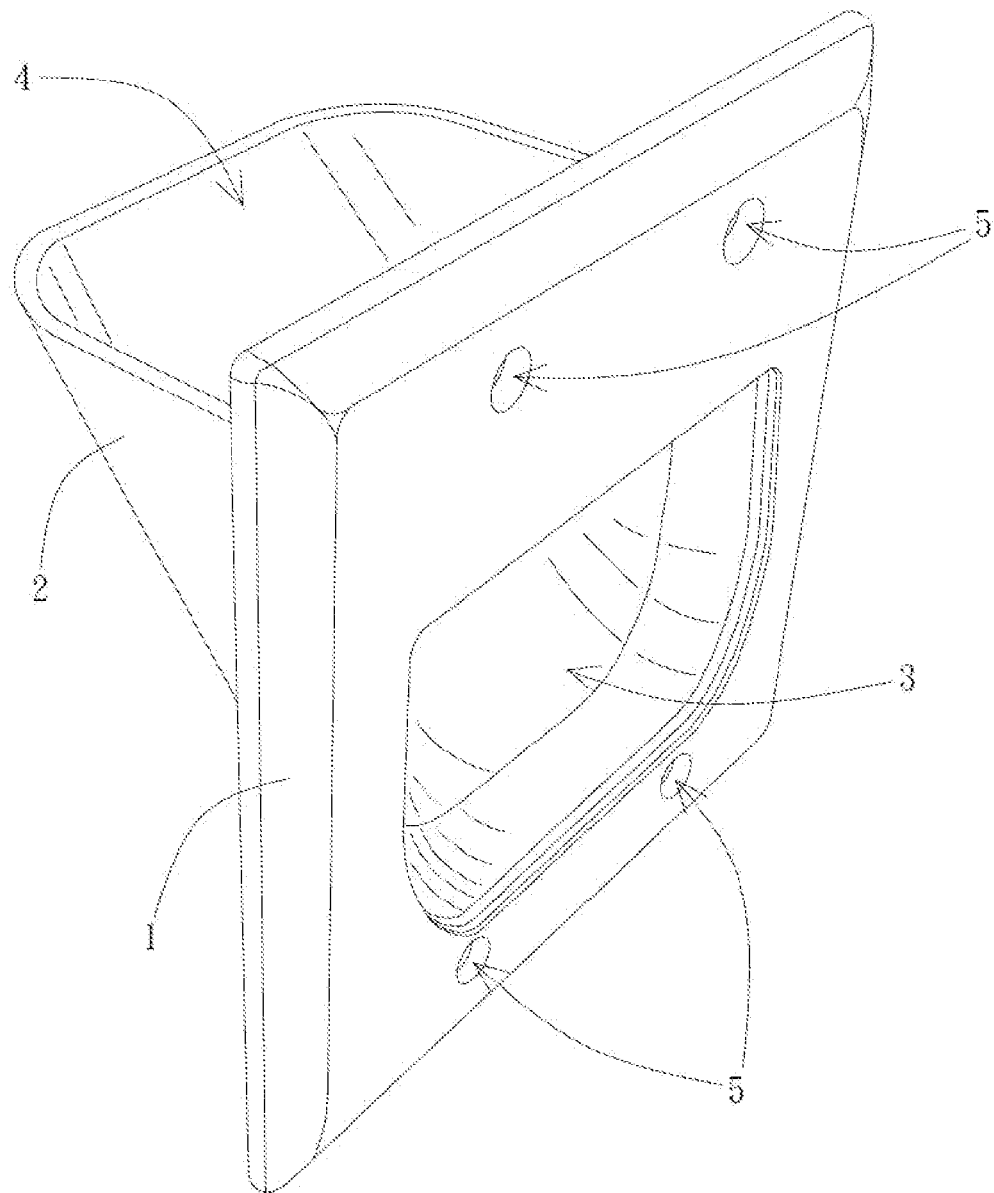
FIG. 1 is a schematic diagram of the conventional wall-mount faceplate.
Figure 2:
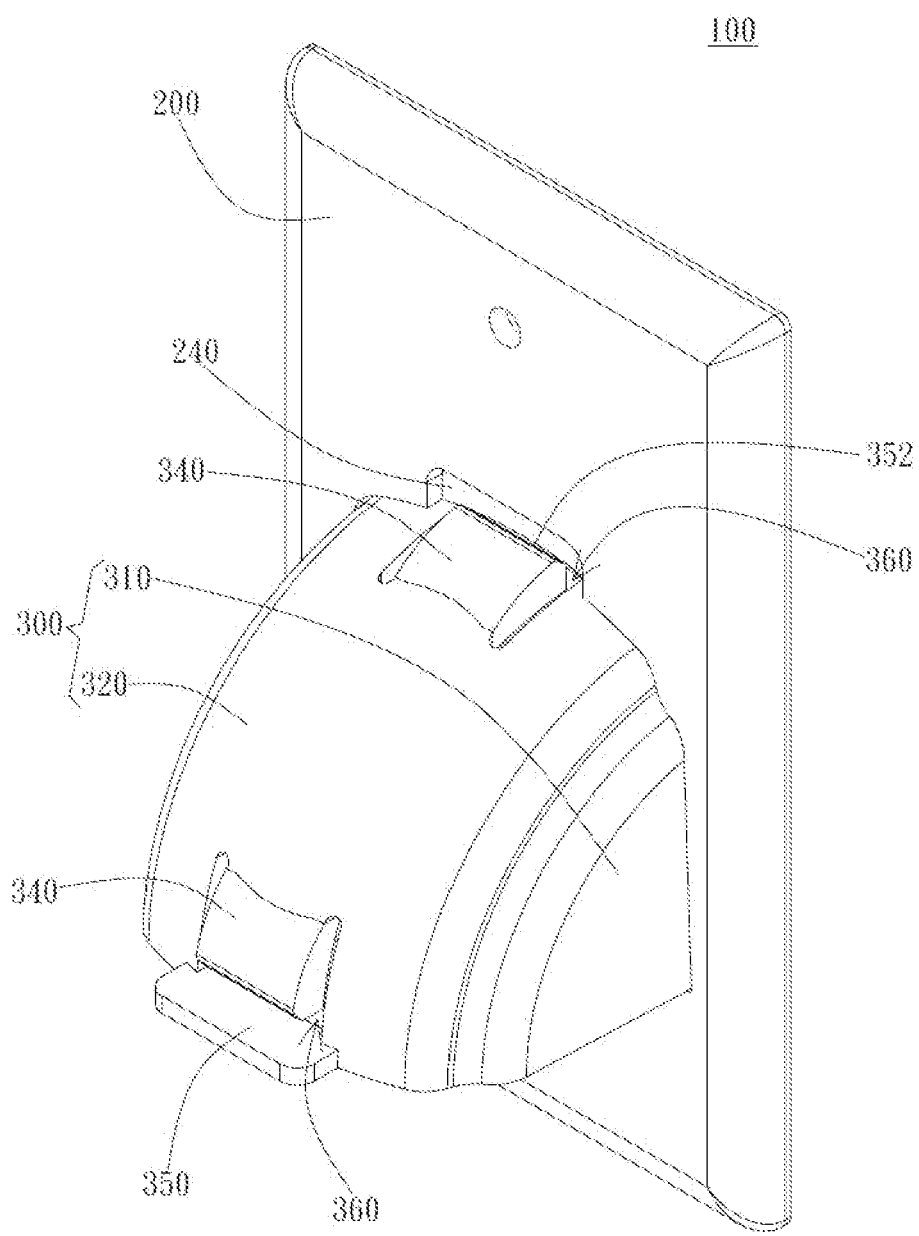
FIG. 2 is a schematic diagram of one embodiment of the present invention.

As the FIG. 2 shows, a mounting faceplate 100 is provided to allow a plurality of cables/transmission lines to go therethrough. The mounting faceplate 100 includes a faceplate body 200 and a nose cover 300. Also referring to FIG. 3A, the faceplate body 200 has an opening 210 near a center portion thereof. The cross-sectional shape of the nose cover 300 corresponds to the shape of the opening 210. In the embodiment shown in FIG. 3A, the shape of the opening 210 is preferably a rectangle shape. However, in other embodiments, the shape of the opening 210 can include triangle, polygon, or other specific shapes. The nose cover 300 has two side plates 310 and a linking plate 320 which connects the two side plates 310. That is, the linking plate 320 is connected between the two side plates 310 to form a first opening 370 and a second opening 380, wherein the first opening 370 and the second opening 380 communicates with each other. The shape of first opening 370 and second opening 380 is similar to the shape of the opening 210. That is, the cross-sectional shape of the nose cover 300 corresponds to the shape of the opening 210. In this embodiment, the shape of the side plate 310 is preferably similar to a triangle, such as a sector, and the shape of the linking plate is similar to an arc shape. Moreover, a pivot unit 330 is provided between the nose cover 300 and the faceplate body 200, so that the nose cover 300 can be rotatably connected to the inner wall of the faceplate body 200 around the opening 210 to selectively change the open direction of the opening 210. In one embodiment, the pivot unit 330 includes a pivot rod and a pivot hole which are interchangeably provided on the nose cover 300 and the faceplate body 200, respectively.

Figure 3A:
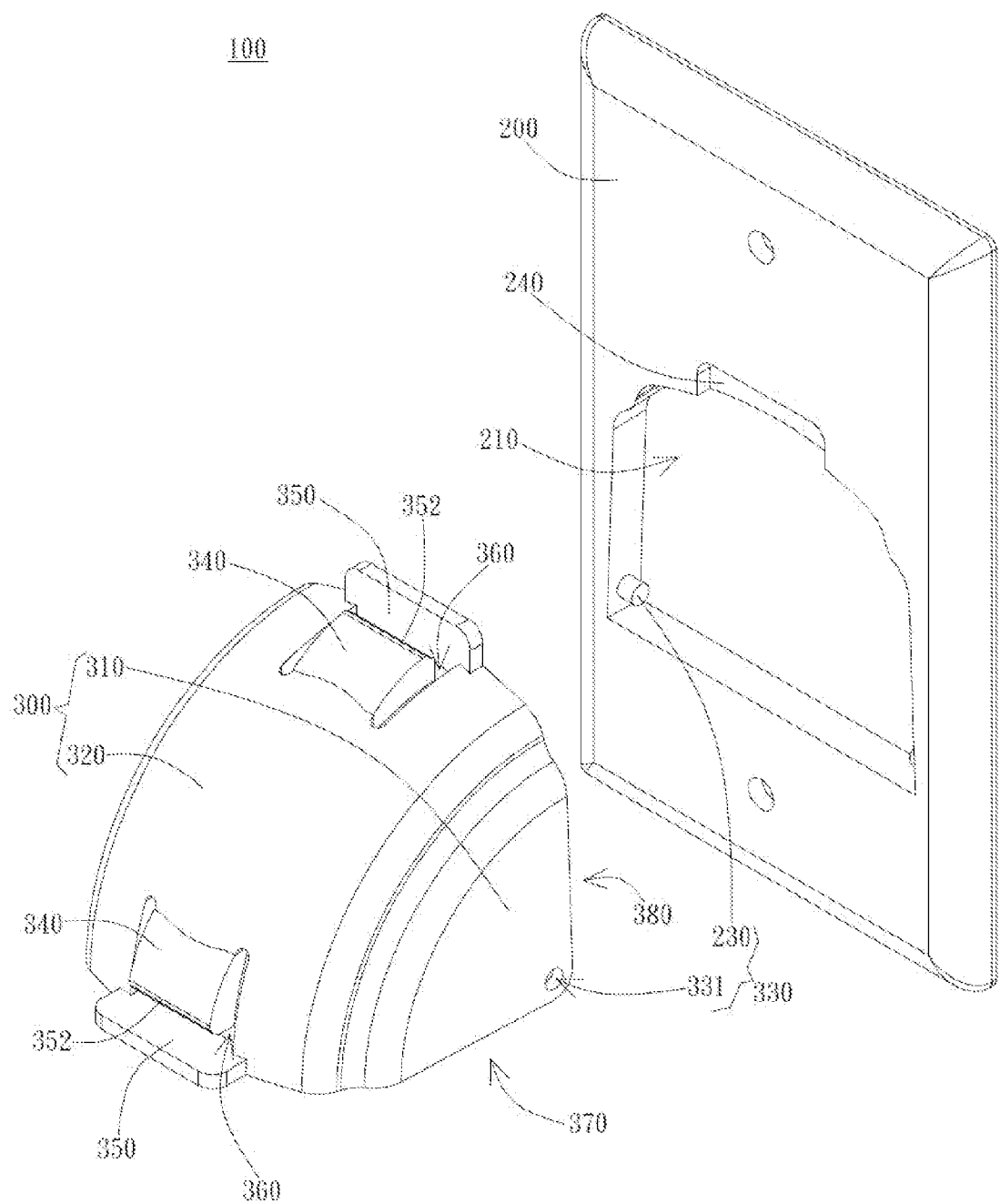
FIG. 3A is an exploded view of an embodiment of FIG. 2.
Figure 3B:
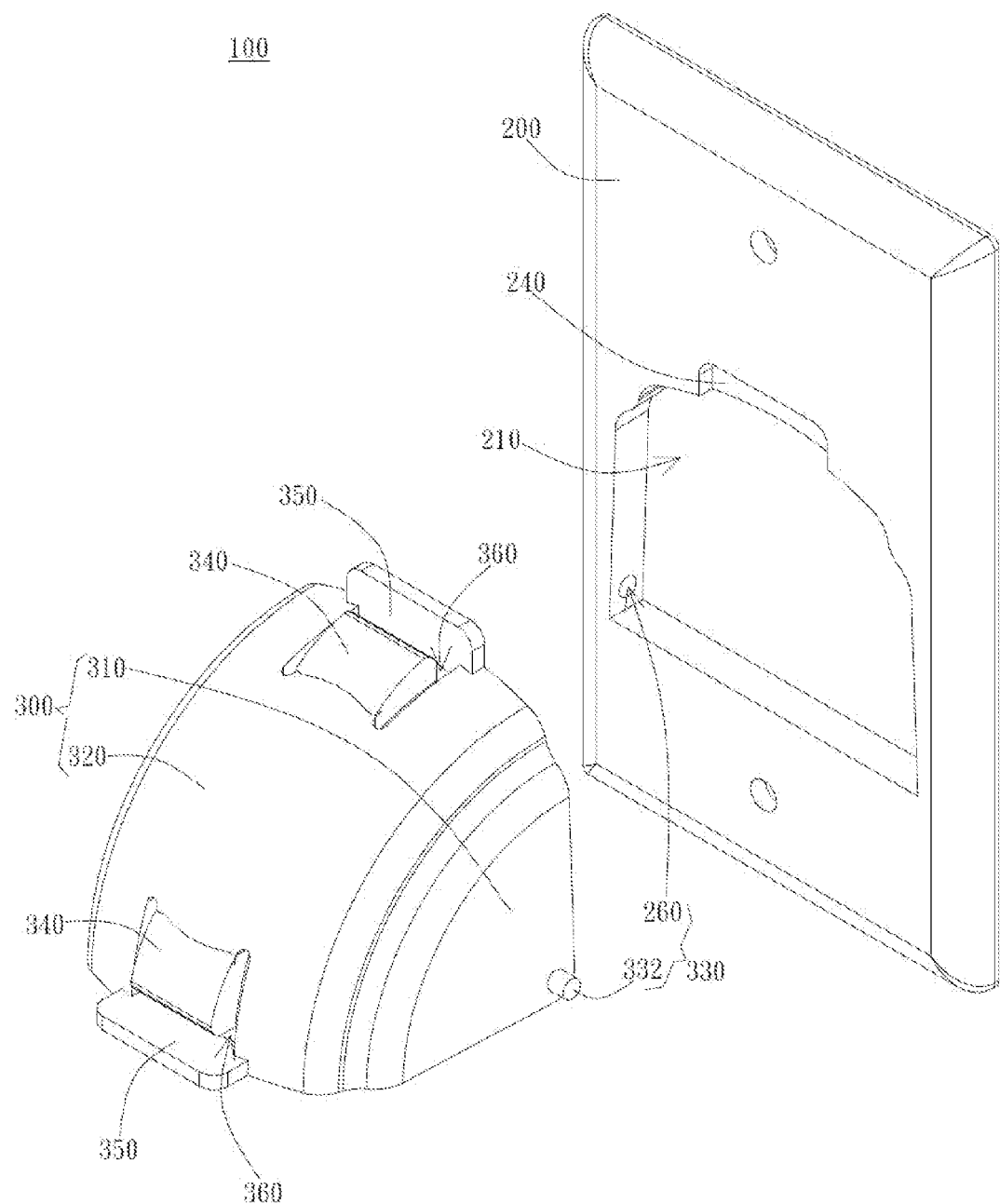
FIG. 3B is an exploded view of another embodiment of FIG. 2.
Figure 4:
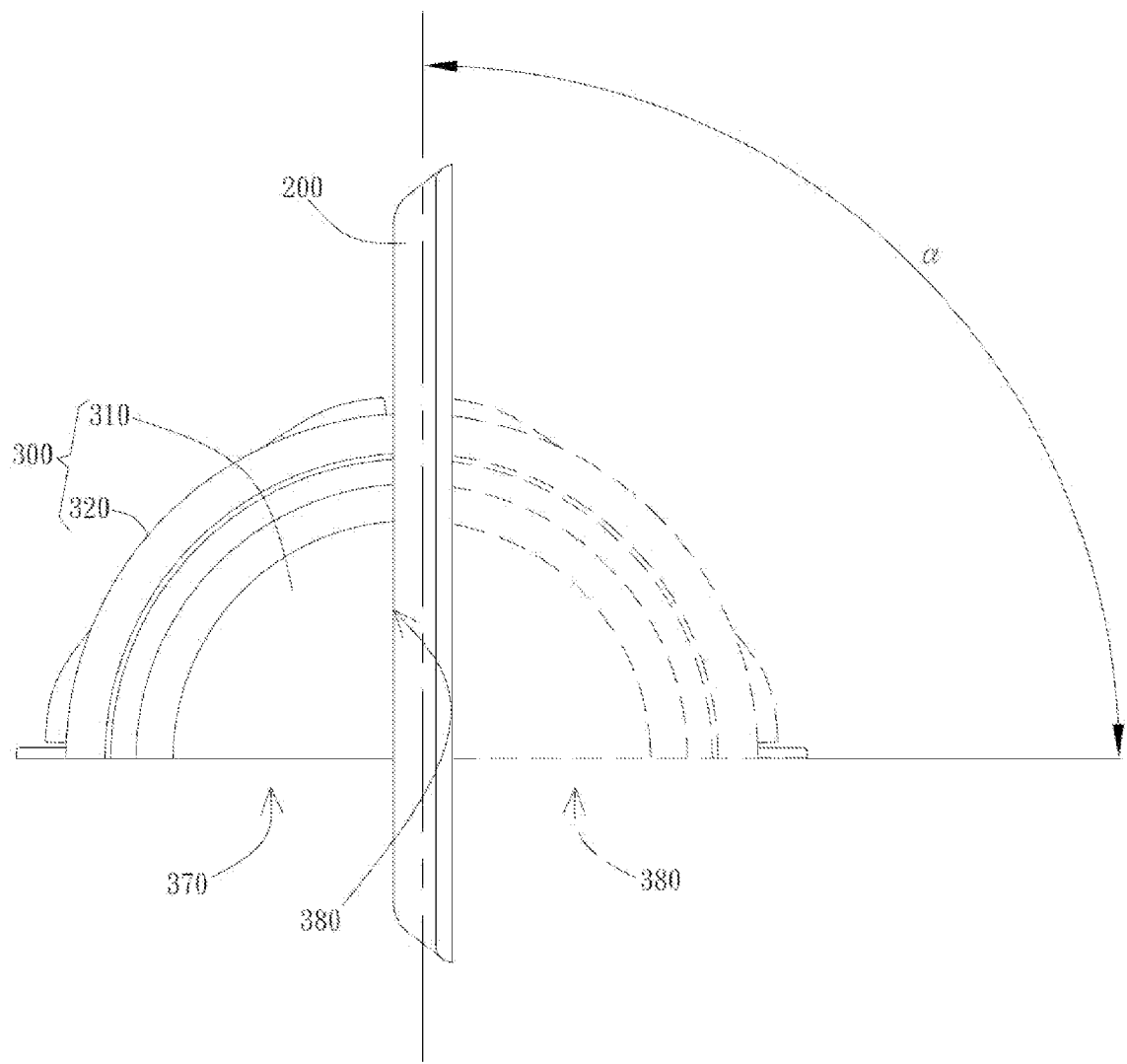
FIG. 4 shows the rotation relationship of the rotatable nose cover and the faceplate body in accordance with one embodiment of the present invention.

As the FIG. 3A shows, in this embodiment, each of the side plate 310 includes a pivot hole 331 and the inner wall around the opening 210 includes a corresponding pivot rod 230 protruding therefrom to be assembled with the pivot hole 331. However, in another embodiment of FIG. 3B, each of the side plate 310 includes a pivot rod 332 and the inner wall around the opening 210 includes a corresponding pivot hole 260. Therefore, the nose cover 300 can rotate about the pivot unit 330 and the rotation angle α ranges from 0 to 90 degrees in this embodiment, as shown in FIG. 4. The embodiment of FIG. 4 illustrates that the nose cover 300 is preferably a quadrant and the length of the arc portion of the nose cover 300 is preferably a quarter of the circumference of a circle, so that the rotation angle is a quarter of a circle, i.e. 90 degrees. However, in other embodiments, the length of the nose cover 300 can correspond to an arc length ranging from 0 to 180 degrees so that the rotation angle can be 0 to 180 degrees to allow the nose cover 300 to selectively rotate between two opposite sides of the faceplate body 200. Moreover, in the embodiment shown in FIG. 4, when the first opening 370 of the nose cover 300 rotates from the horizontal position on one side of the faceplate body 200 toward the opening 210, the second opening 380 correspondingly rotates from the vertical position to the horizontal position on the other side of the faceplate body 200 (indicated by the broken line), so the open direction of the nose cover 300 with respect to the faceplate body 200 changes 180 degrees.

Moreover, as shown in FIG. 3A, each of two opposite ends of the linking plate 320 has a bump 340 protruding from the linking plate 320 and can be selectively engaged with the faceplate body 200 at one side of the opening 210. That is, the bump 340 is a raised part gradually protruding from the surface of the linking plate 320, and the top end face of the bump 340 is preferably a smooth curve surface 352. The linking plate 320 further includes a stopper 350 and a groove 360, wherein the groove 360 is formed between the stopper 350 and the bump 340. In this embodiment, the groove 360 is formed around the bump 340 to allow the bump 340 to be flexible. For example, the groove 360 surrounds the bump 340 in a manner that only one side/end of the bump 340 is connected to the linking plate 320. With such a configuration, the bump 340 has certain flexibility with respect to the linking plate 320, i.e. the bump 340 is vertically moveable with respect to the surface of the linking plate 320. The stopper 350 vertically extends upward from the edge of linking plate 320 to limit the moving range of the nose cover 300 in the open direction of the opening 210. The faceplate body 200 further includes a positioning portion 240 on one side of the opening 210, wherein the positioning portion 240 is configured to be engaged with the bump 340.

As FIGS. 2-4 show, when the pivot holes 331 of the nose cover 300 are assemble with the pivot rods 230 of the faceplate body 200, the nose cover 300 can be selectively rotated with respect to the faceplate body 200. As shown in FIGS. 2-4, when the nose cover 300 intends to rotate from one side of the faceplate body 200 to the other side of the faceplate body 200, an external force greater than the flexibility of the bump 340 is exerted onto the bump 340. The external force pushes the bump 340 downward until the smooth curve surface 352 moves across under the positioning portion 240 to disengage the bump 340 of the nose cover 300 from the positioning portion 240 of the faceplate body 200. After the bump 340 which is disposed on one end of the linking plate 320 of the nose cover 340 is disengaged from the positioning portion 240 of the faceplate body 200, the nose cover 300 continues rotating forward until the positioning portion 240 encounters with a gradually raised bump 340 which is disposed on the opposite end of the nose cover 340 and then enters into the groove 360 disposed between the stopper 350 and the bump 340 on the opposite end of the linking plate 320. As such, the positioning portion 240 of the faceplate body 200 is engaged with the bump 340 of the linking plate 320 on the opposite end of the nose cover 300, and the stopper 350 is preferably in contact with the faceplate body 200, i.e. the positioning portion 240. Consequently, the nose cover 300 is rotated and disposed on the other side of the faceplate plate 200, as shown in FIG. 4 (indicated by the broken line). It is noted that due to the restriction of the stopper 350, the nose cover 300 can not rotate any further. The shape of the stopper 350 preferably corresponds to the shape of the positioning portion 240, so that when the bump 340 is engaged with the positioning portion 240, the stopper 350 and the faceplate body 200 are coplanar to make the mounting faceplate 100 have a substantially smooth appearance (see FIG. 8).

Figure 5:
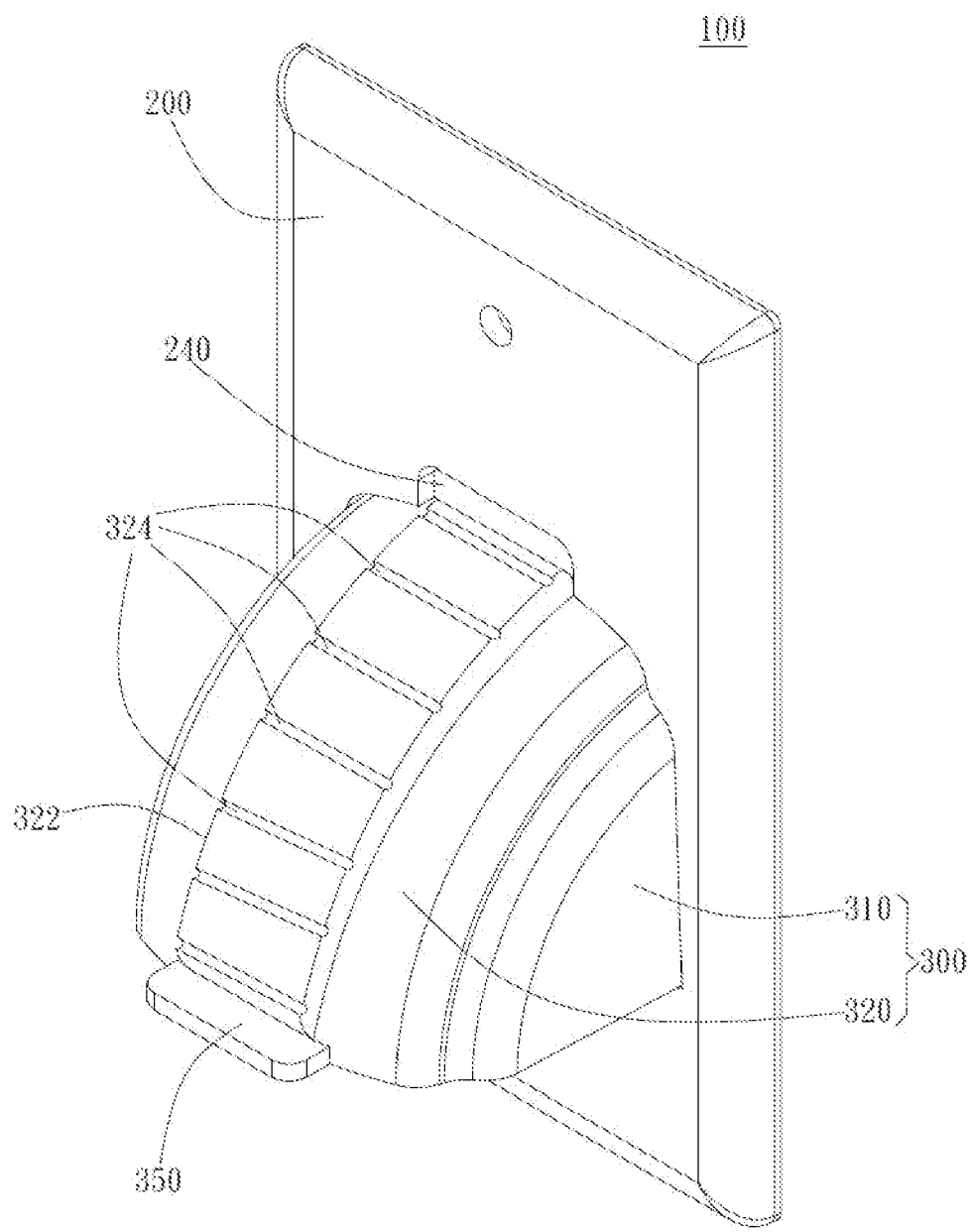
FIG. 5 is another embodiment of the mounting faceplate of the present invention.

Another embodiment of the present invention is shown in FIG. 5. In this embodiment, in addition to the bumps 340 on two opposite ends of the linking plate 320, the nose cover 300 further includes a protrusion 322 on the linking plate 320. In particular, a plurality of grooves 324 are formed on the protrusion 322 to selectively engage with the positioning portion 240. Wish such a configuration, the positioning portion 240 of the faceplate body 200 can be selectively engaged with not only the bumps 340 of the nose cover 300 on two opposite ends, but also any one of the grooves 324 of the protrusion 322 to allow the mounting faceplate 100 with multiple assembly configurations (i.e. various open directions of the opening 210 are available) to meet different construction needs.

Figure 6A:
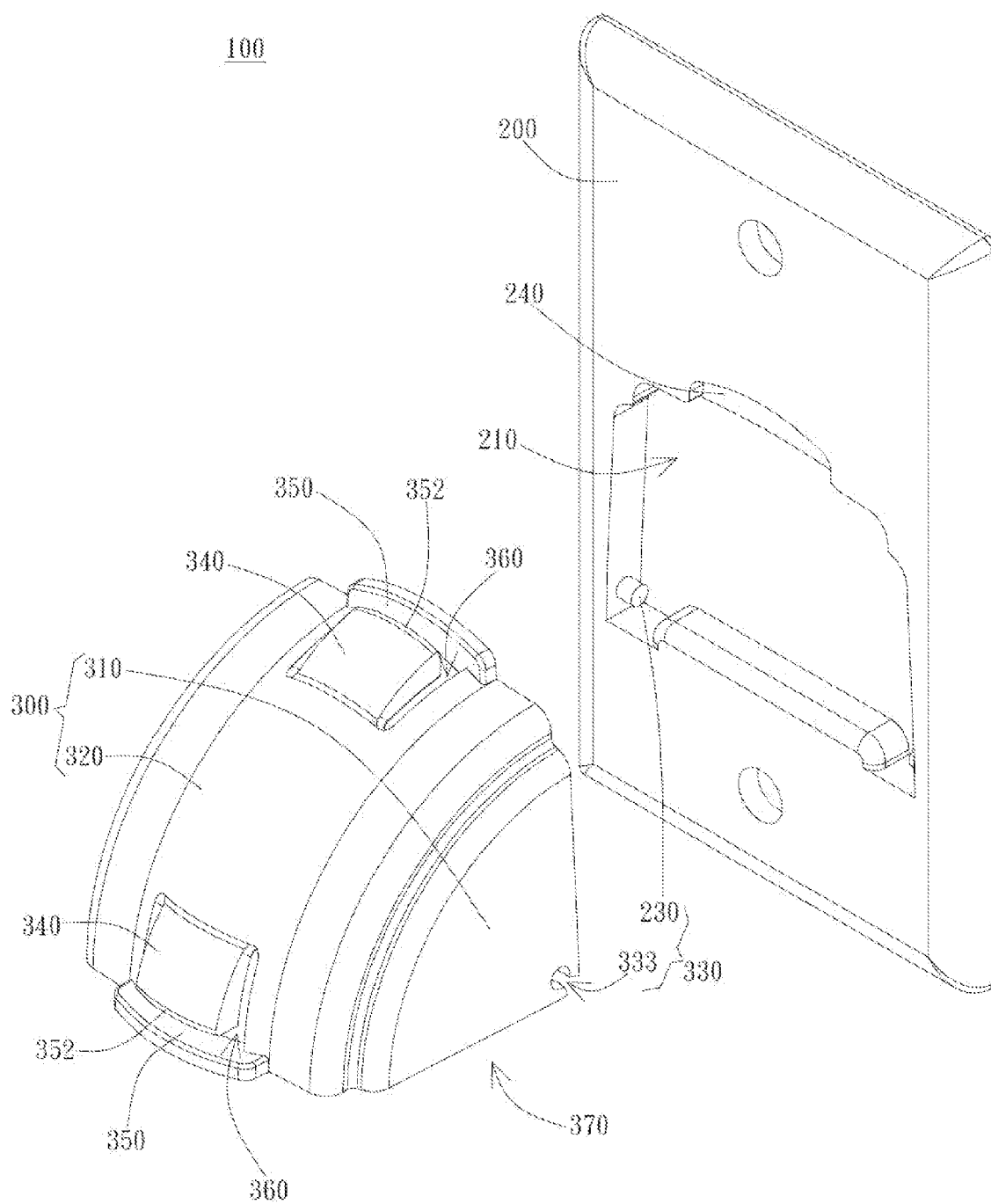
FIG. 6A is an exploded view of another embodiment of the present invention.
Figure 6B:
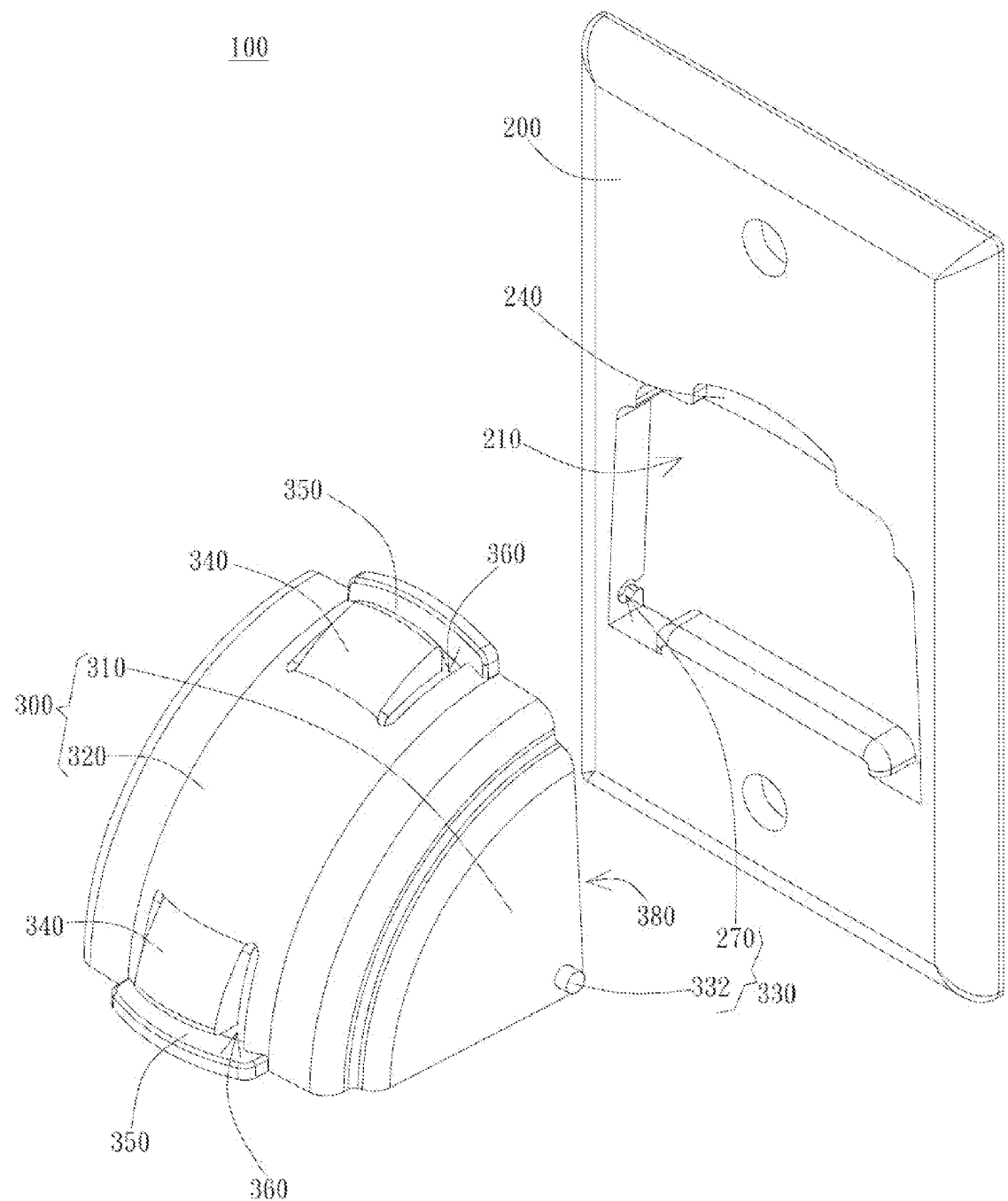
FIG. 6B is an exploded view of another embodiment of the present invention.

FIG. 6A and FIG. 6B are another embodiments of the present invention. The difference between the embodiments of FIG. 6A and FIG. 3A is the structure of the pivot unit 330, wherein the pivot hole 333 of the nose cover 300 includes a breach and forms an open circle. The difference between the embodiments of FIG. 6B and FIG. 3B is also the structure of the pivot unit 330, wherein the pivot hole 270 of the faceplate body 200 includes a breach and forms an open circle. As shown in FIG. 6A and FIG. 6B, the pivot hole 333 or 270 having the breach increases the flexibility and convenience of engaging with the pivot rod 230 or 332 to form the pivot unit 330 more easily.

Figure 7:
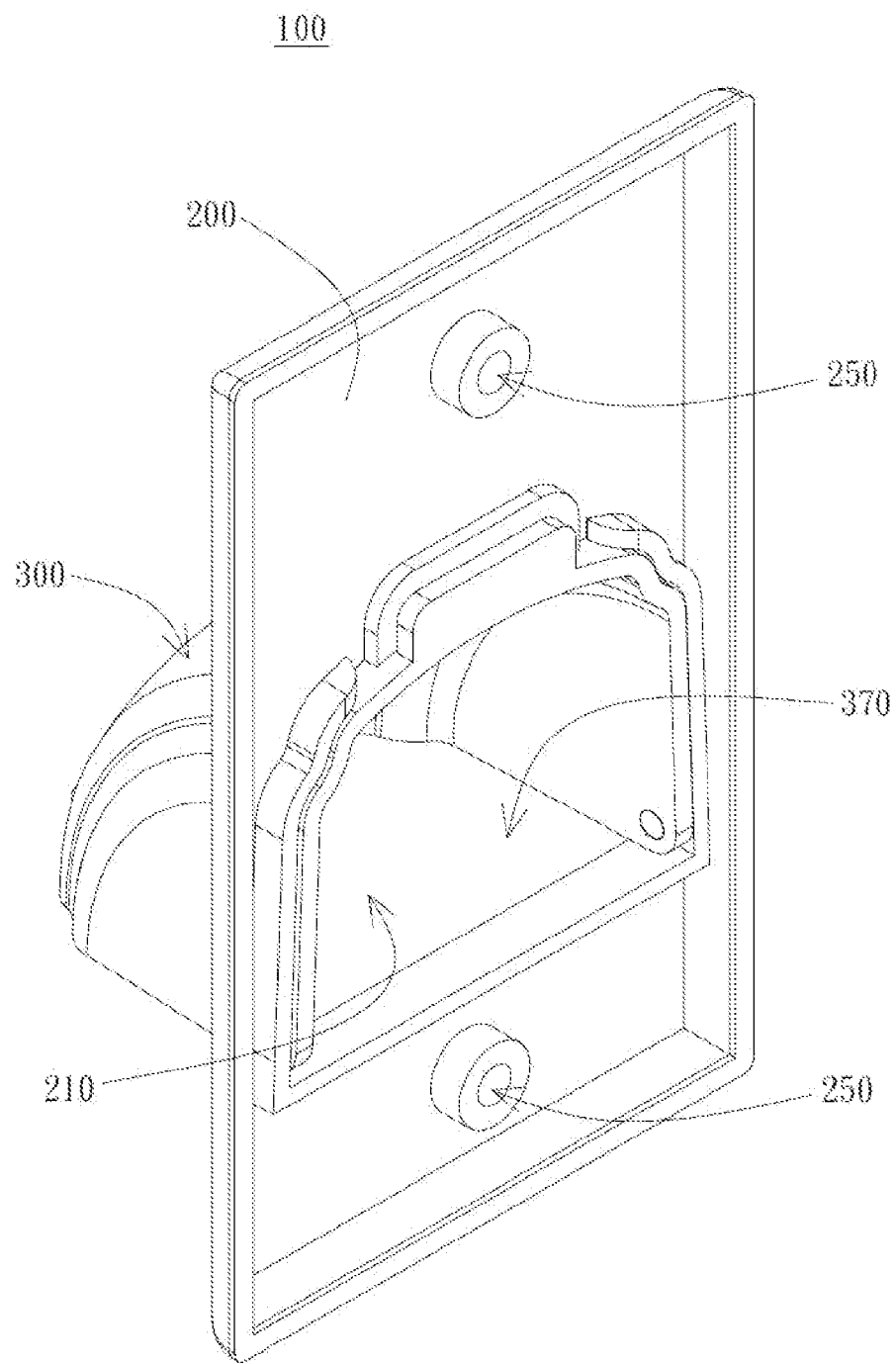
FIG. 7 is a rear view of the mounting faceplate of the present invention.

FIG. 7 is a rear view of the mounting faceplate of the present invention. That is, the schematic diagram is viewed from the wall side that the nose cover is engaged with the faceplate body. Since the mounting faceplate 100 is mounted on the wall with the opening 210 of the faceplate body 200 corresponding to the hole in the wall, the mounting faceplate 100 can be mounted on the wall by the fastening elements such as screws, nails or other similar elements through the mounting holes 250. As shown in FIG. 7, the open direction of the first opening 370 which communicates with the opening 210 faces downward so that the cables (or transmission lines, not shown) can be managed and guided through the opening 210 along the open direction of the first opening 370. However, in another embodiment, the mounting faceplate 100 can be disposed upside down (i.e. FIG. 7 is rotated 180 degrees), so that the open direction of the first opening 370 faces upward, and the cables (or transmission lines, not shown) can be managed and guided through the opening 210 along the open direction of the first opening 370. Therefore, the mounting faceplate 100 of the present invention can provide two different configurations to accommodate different requirements.

Figure 8:
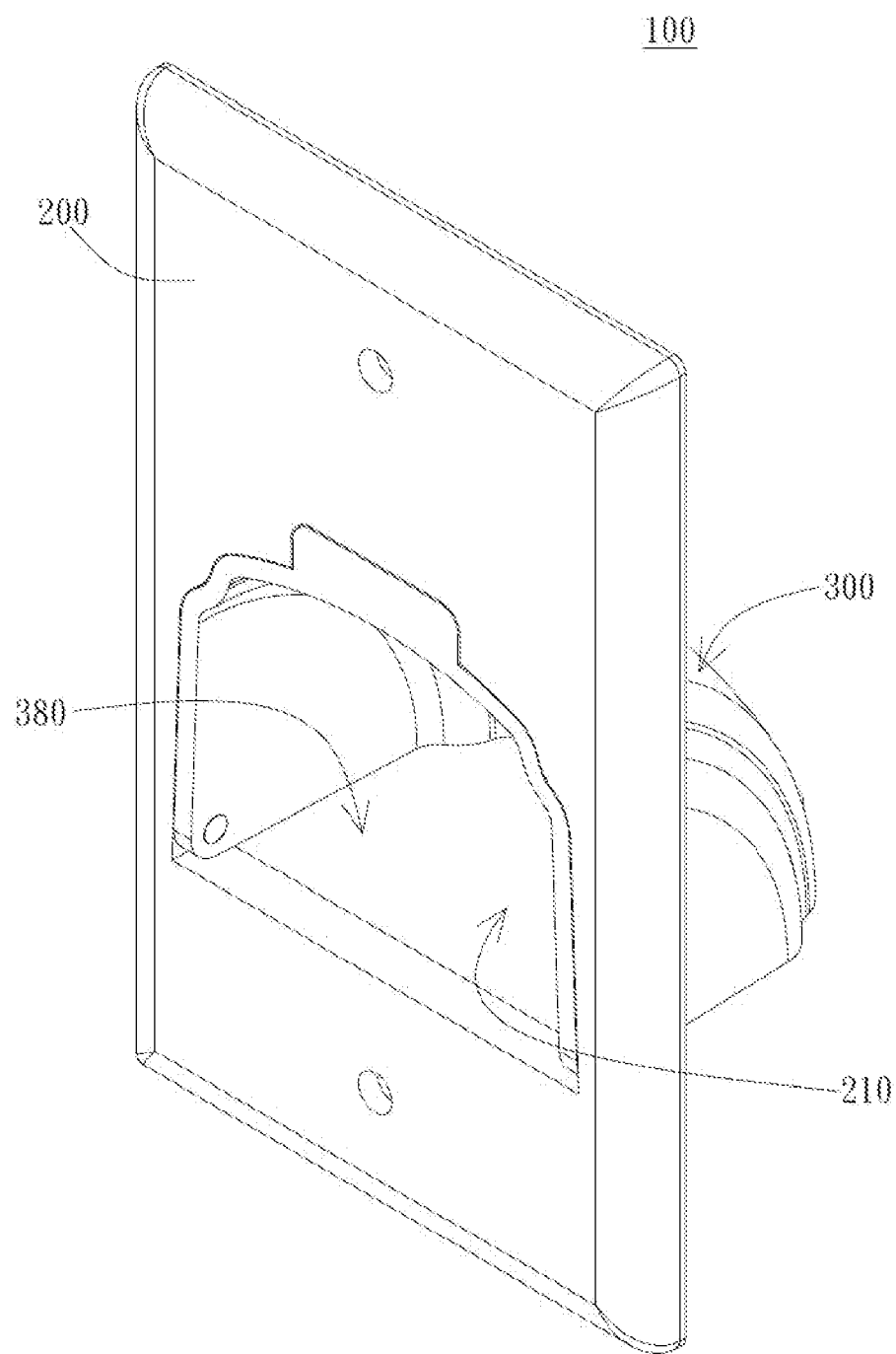
FIG. 8 is a front view of the mounting faceplate of the present invention.

FIG. 8 is a front view of the mounting faceplate of the present invention. As the FIG. 8 shows, when the nose cover 300 rotates to the other side of the faceplate body 200 and is engaged with the positioning portion 240 on one side of the opening 210, the nose cover 300 and the faceplate body 200 are substantially coplanar so that the mounting faceplate 100 has a substantially smooth appearance. In this embodiment, the nose cover 300 is embedded into the hole in the wall (not shown), and the second opening 380 faces downward to guide and manage the transmission lines along the downward open direction. However, in other embodiments, the mounting faceplate 100 can be disposed upside down (i.e. FIG. 8 is rotated 180 degrees), so that the open direction of the first opening 380 faces upwardly, and the cables (or transmission lines, not shown) can be managed and guided through the opening 210 along the upward open direction of the first opening 380. Therefore, the mounting faceplate 100 of the present invention can provide two more different configurations and totally four different configurations to accommodate different requirements.

In addition, the faceplate body 200 and the nose cover 300 are preferably made of plastic or other suitable materials. The faceplate body 200 and the nose cover 300 are preferably formed as two separate components and then assembled together.

Although the preferred embodiments of the present invention have been described herein, the above description is merely illustrative. Further modification of the invention herein disclosed will occur to those skilled in respective arts and all such modifications are deemed to be within the scope of the invention defined by the appended claims.

What is claimed is:

1. A mounting faceplate, comprising:
   a faceplate body having an opening and including a positioning portion on one side of the opening;
   a nose cover having two side plates and a linking plate connected between the two side plates, the linking plate further comprising a first bump and a second bump, wherein the first bump and the second bump are disposed at two opposite ends of the linking plate for contacting with the faceplate body on one side of the opening; and
   a pivot unit disposed between the faceplate body and the nose cover and radially away from the first bump and the second bump so that the nose cover is rotatably connected to the faceplate body and the first bump and the second bump selectively engage with the positioning portion to change an open direction of the opening.

2. The mounting faceplate of claim 1, wherein two ends of the linking plate each comprises a stopper and a groove, one groove is formed between the stopper and the first bump and another groove is formed between the stopper and the second bump.

3. The mounting faceplate of claim 2, wherein the stopper vertically extends upward from an edge of the linking plate to limit a moving range of the nose cover in the open direction of the opening.

4. The mounting faceplate of claim 2, wherein the grooves are respectively formed around the first bump and the second bump to make the first bump and the second bump to be flexible.

5. The mounting faceplate of claim 1, wherein the first bump and the second bump are raised parts extending upwardly from a surface of the linking plate.

6. The mounting faceplate of claim 1, wherein the pivot unit comprises a pivot hole on the nose cover and a pivot rod on an inner wall of the faceplate body around the opening, the pivot rod is engaged with the pivot hole.

7. The mounting faceplate of claim 6, wherein the pivot hole has a breach and in form of an open circle.

8. The mounting faceplate of claim 1, wherein a rotation angle of the nose cover with respect to the pivot unit ranges from 0 to 90 degrees.

9. The mounting faceplate of claim 1, wherein the linking plate further comprises a protrusion with a plurality of grooves to allow the faceplate body to be selectively engaged therewith.

10. The mounting faceplate of claim 1, wherein the pivot unit comprises a pivot rod on the nose cover and a pivot hole on an inner wall of the faceplate body around the opening, the pivot rod is engaged with the pivot hole.

11. The mounting faceplate of claim 10, wherein the pivot hole has a breach and in form of an open circle.

12. A mounting faceplate, comprising:
    a faceplate body having an opening and including a positioning portion on one side of the opening;
    a nose cover having two side plates and a linking plate connected between the two side plates, the linking plate includes a first stopper and a second stopper, wherein the first stopper and the second stopper are disposed at two opposite ends of the linking plate to limit a moving range of the nose cover in an open direction of the opening; and
    a pivot unit disposed between the faceplate body and the nose cover and radially away from the first stopper and the second stopper so that the nose cover is rotatably connected to the faceplate body and the first stopper and the second stopper selectively engage with the positioning portion to change the open direction of the opening.

13. The mounting faceplate of claim 12, wherein the linking plate further comprises a bump on its end for contacting with the faceplate body on one side of the opening.

14. The mounting faceplate of claim 13, wherein two ends of the linking plate each comprises a groove and the bump, one groove is formed between the first stopper and the bump and another groove is formed between the second stopper and the bump.

15. The mounting faceplate of claim 14, wherein the first stopper and the second stopper vertically extends upward from an edge of the linking plate to limit a moving range of the nose cover in the open direction of the opening.

16. The mounting faceplate of claim 14, wherein the groove is formed around the bump to make the bump be flexible.

17. The mounting faceplate of claim 13, wherein the bump is a raised part extending upwardly from a surface of the linking plate.

18. The mounting faceplate of claim 12, wherein the linking plate further comprises a protrusion with a plurality of grooves to allow the faceplate body to be selectively engaged therewith.

* * * * *